United States Patent [19]

Matty

[11] 3,979,690

[45] Sept. 7, 1976

[54] FAILSAFE CONTROLLED GAIN INVERTING AMPLIFIER APPARATUS

[75] Inventor: Thomas C. Matty, North Huntingdon, Pa.

[73] Assignee: Westinghouse Electric Corporation, Pittsburgh, Pa.

[22] Filed: Apr. 29, 1975

[21] Appl. No.: 572,814

[52] U.S. Cl. .................................. 330/107; 330/109
[51] Int. Cl.² ............................................ H03F 1/36
[58] Field of Search ............. 330/107, 109; 328/167

[56] References Cited
UNITED STATES PATENTS

| | | | |
|---|---|---|---|
| 3,408,507 | 10/1968 | Martin | 307/202 X |
| 3,774,125 | 11/1973 | Condon et al. | 328/167 X |

OTHER PUBLICATIONS

Brandt, "Active Resonators Save Steps in Designing Active Filters," *Electronics*, Apr. 24, 1972 pp. 106–110.

*Primary Examiner*—James B. Mullins
*Attorney, Agent, or Firm*—R. G. Brodahl

[57] ABSTRACT

An inverting amplifier apparatus is disclosed, which provides, in a failsafe manner, a predetermined initial gain that decreases linearly over a known range of frequencies. The disclosed inverting amplifier apparatus includes an amplifier whose feedback impedance contains a four terminal capacitor in parallel with a feedback resistor. The use of a four terminal capacitor as a feedback element makes the amplifier failsafe by preventing a failure mode of the amplifier in which the opening of the feedback element results in infinite AC gain of the amplifier. A virtual ground is provided at the junction of an input resistor, the feedback resistor, and one terminal of the four terminal capacitor, so the amplifier apparatus may simultaneously accommodate multiple input signals thereby permitting the amplifier apparatus to perform summing operations. The linearly decreasing gain of the amplifier apparatus may be altered to a predetermined non-linear gain over a known range of frequency by the introduction of an inductance connected in series with the feedback resistor of the feedback impedance.

12 Claims, 10 Drawing Figures

FAILSAFE CONTROLLED GAIN INVERTING AMPLIFIER APPARATUS

BACKGROUND OF THE INVENTION

In a number of control systems, for example transportation vehicle operation control systems, there is a need for amplifier apparatus which is failsafe in its operation. One of the main considerations in the design of amplifier apparatus for use in such a system is that the amplifier apparatus gain be controlled within safe limits in the event of a failure in the amplifier apparatus.

According to the here described apparatus, an improved failsafe inverting amplifier is disclosed which is widely useful and relatively economical when compared with failsafe inverting amplifiers of the prior art.

SUMMARY OF THE INVENTION

Inverting amplifier apparatus is provided having a failsafe controlled gain and which includes one or more apparatus input terminals, an apparatus output terminal, and a source of operating potential. An amplifier having first and second input terminals and an output terminal has the second input terminal connected to the source of operating potential. The amplifier feedback impedance includes a four terminal capacitor which has the first terminal connected to the apparatus output terminal, the second terminal connected to the output terminal of the amplifier, the third terminal connected to the first input terminal of the amplifier, and the fourth terminal connected to each amplifier apparatus input terminal through a separate input impedance. The amplifier feedback impedance also includes an impedance element connected between the first and fourth terminals of the capacitor, which impedance element may be comprised of a resistor or, alternatively, a resistor in series with an inductance.

Figure 1:
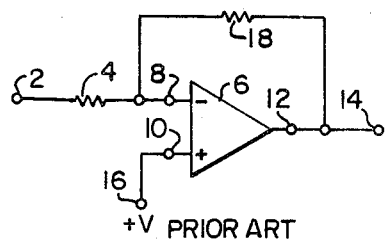
FIG. 1 is a schematic diagram representation of a well known inverting operational amplifier apparatus as known in the prior art.
Figure 2:
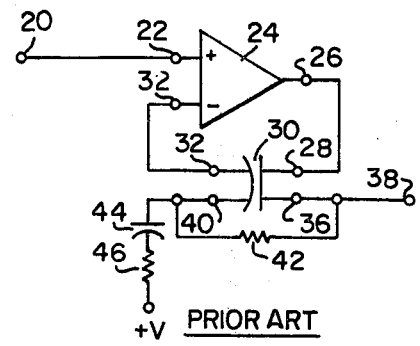
FIG. 2 is a schematic diagram representation of a well known non-inverting operational amplifier apparatus as known in the prior art.
Figure 6:
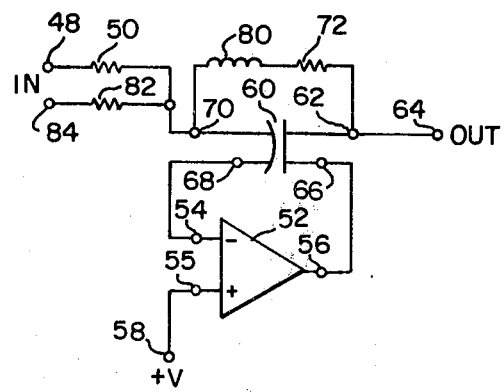
FIG. 6 is a schematic diagram representation of a modification of the inverting amplifier apparatus of FIG. 5 with the four terminal capacitor connected to a second amplifier apparatus input terminal through a second input impedance.
Figure 7:
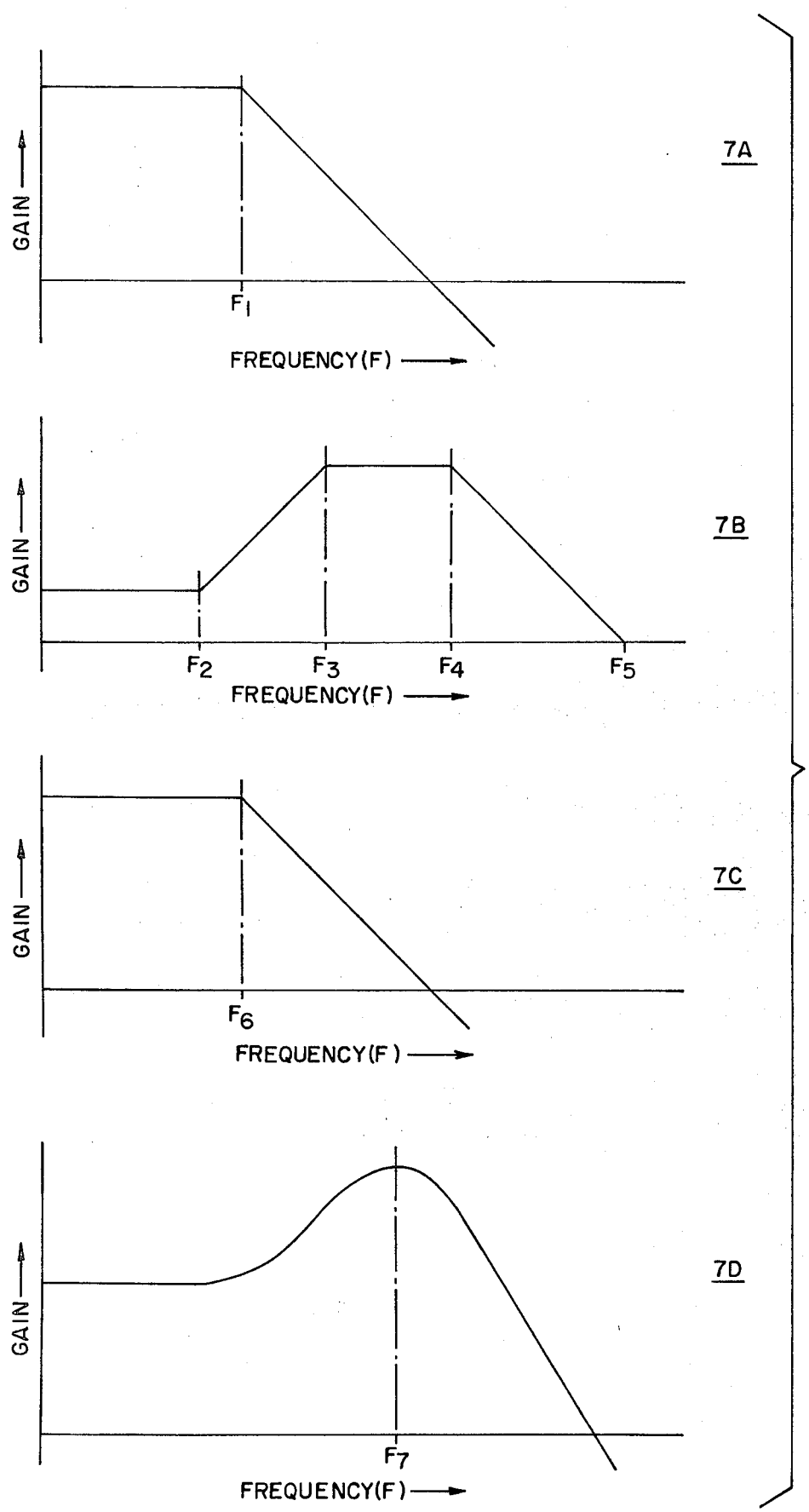

Curves 7A and 7B of FIG. 7 are graphic representations of the change in the gain of the amplifier with respect to a change in frequency for the prior art inverting amplifier apparatus of FIG. 1 and the prior art non-inverting amplifier apparatus of FIG. 2. Curves 7C and 7D of FIG. 7 are graphic representations of the change in the gain of the amplifier with respect to a change in frequency for the disclosed inverting amplifier apparatus of FIGS. 3 and 4 and the disclosed inverting amplifier apparatus of FIGS. 5 and 6, respectively.

DESCRIPTION OF THE PREFERRED EMBODIMENT

An inverting operational amplifier apparatus as well known in the prior art is illustrated in FIG. 1. An input terminal 2 is connected to an input resistor 4. The amplifier circuit contains a conventional amplifier 6 having input terminals 8 and 10 and an output terminal 12. The output terminal 12 is connected to an amplifier apparatus output terminal 14 while a potential source 16 is connected to amplifier input 10 and a feedback impedance 18 is connected between amplifier output 12 and amplifier input 8. The AC gain of the operational amplifier is described by the equation:

$$\text{Gain} = Z_f/Z_I \qquad (1)$$

In the above equation $Z_f$ is the feedback impedance 18, and $Z_I$ is the input impedance 4. For an inverting operational amplifier to have a failsafe predetermined gain, it is necessary that the gain of the circuit does not increase above a predetermined value under normal or probable failure modes of the feedback or input impedances of the amplifying network.

For purposes of description, the amplifier is considered to have a failsafe predetermined gain when the gain of the amplifier is not allowed to substantially increase during any failure mode. If the gain of the amplifier approaches zero or the amplifier goes into direct current (DC) saturation during a failure mode, that failure mode is considered safe. The failure modes of the feedback and input impedances of the network therefore require analysis.

With reference to FIG. 1, the two failure modes of $Z_f$ are that the impedance shorts or the impedance opens. If $Z_f$ shorts, the impedance of the element equals zero and, according to equation (1), the gain of the amplifier approaches zero which is a safe failure mode. If, however, $Z_f$ opens, its impedance approaches infinity and the gain of the amplifier circuit also approaches infinity which is an unsafe operational condition. The failure modes of the circuit input impedance $Z_I$ are that the impedance opens or shorts. If $Z_I$ opens, its impedance approaches infinity and the gain of the network approaches zero which is a safe failure mode. If, however, $Z_I$ shorts, its impedance approaches zero and the gain of the amplifier circuit approaches infinity which is an unsafe operational condition.

It is seen, therefore, that for the circuit of FIG. 1 to have a failsafe predetermined gain, it is necessary that $Z_f$ is an element that under no circumstances is allowed to open or, alternatively, the opening of $Z_f$ will be compensated for. Also, it is seen that $Z_I$ must be an element which does not short out or, alternatively, the shorting out of the element will be compensated for.

FIG. 2 shows a non-inverting amplifier of the prior art which is considered to have a failsafe predetermined gain. A circuit input terminal 20 is connected to a first input terminal 22 of a conventional amplifier 24 which has an output terminal 26 connected to a first input terminal 28 of a four terminal capacitor 30. A second terminal 32 of the capacitor 30 is connected to a second input terminal 34 of the amplifier 24. A third terminal 36 of the capacitor 30 is connected to a circuit output terminal 38 and to the fourth terminal 40 of the capacitor 30 by way of a DC bias resistor 42. The terminal 40 of the capacitor 30 is connected to a source of operating potential +V by way of the series connection of a capacitor 44 and a resistor 46. As explained in U.S. Pat. No, 3,838,353 of T.C. Matty, the amplifier of FIG. 2 has a failsafe predetermined gain in which the feedback element does not open or, alternatively, the opening of such element is compensated for, and the input impedance is an element which does not short or, alternatively, the shorting of such element is compensated for.

Figure 3:
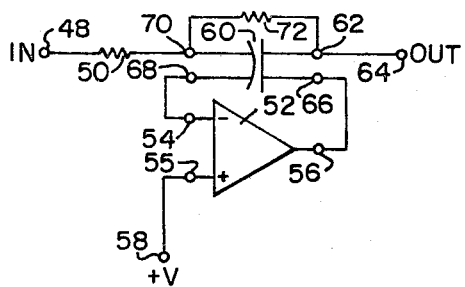
FIG. 3 is a schematic diagram representation of the present inverting amplifier apparatus.

FIG. 3 represents a schematic diagram of the present amplifier having a failsafe predetermined gain in which, for specified failure modes, the feedback impedance is the type which does not open or, alternatively, the opening of such element is compensated for; and the input impedance is an element which does not short or, alternatively, the shorting of which is compensated for. In the inverting amplifier circuit, an amplifier circuit input terminal 48 is connected to an input impedance 50. A conventional amplifier 52 having first and second input terminals 54 and 55 and an output terminal 56, has the second input terminal 55 connected to a source of voltage potential 58. A four terminal capacitor 60 has a first terminal 62 connected to an amplifier circuit output terminal 64; a second terminal 66 connected to the output terminal 56 of amplifier 52; a third terminal 68 connected to amplifier input terminal 54; and a fourth terminal 70 connected to input impedance 50. A feedback resistance 72 is connected to terminals 62 and 70 of the four terminal capacitor 60.

The gain of the amplifier circuit of FIG. 3 is also represented by the above equation (1), where $Z_f$ is the feedback impedance of amplifier 52 and $Z_I$ is the input impedance of amplifier 52. For the circuit of FIG. 3, $Z_f$ is represented by the following equation:

$$Z_f = \frac{(R_f)\, 1/jWC_f}{R_f + 1/jWC_f} \quad (2)$$

where $R_f$ is the impedance of resistor 72, and $1/jWC_f$ is the impedance of capacitor 60. If resistor 72 is selected so as to have an impedance substantially greater than the impedance $1/jWC_f$ of capacitor 60, then the feedback impedance may be represented by the equation:

$$Z_f = 1/jWC_f \quad (3)$$

The input impedance of the amplifier is represented by the following equation:

$$Z_I = R_I \quad (4)$$

where $R_I$ is the impedance of resistor 50. Substituting in equation (1) with equations (3) and (4), the equation for the gain of the circuit is represented by:

$$G = \frac{1/jWC_f}{R_I} \quad (5)$$

From equation (5), it can be seen that, for certain values of feedback and input impedance, the disclosed amplifying circuit will be failsafe for predetermined failure modes. If the input resistor 50 were to short, the gain of the amplifier would approach infinity and an unsafe condition would be created. If the capacitance of capacitor 60 were to approach zero, the gain of the amplifying circuit would approach infinity and this also would create an unsafe condition. Therefore, the failure modes under which resistor 50, and capacitor 60 decrease in value must be excluded from possible failure modes by component selection.

Presently, high reliablity, four terminal capacitors which have extremely low failure rates are available in the market place. That is, the chances of these capacitors shorting or opening are negligible. Such capacitors, for example, may be 4 terminal devices of mylar or glass insulated construction. In the latter capacitor, there is a fused monolithic construction of proven glass dielectric and conductive elements which provide outstanding performance in stability and reliability. Accordingly, the use of such capacitors are recommended in the practice of the present invention.

Other possible failure modes of resistors 50 or 72 would not effect the gain of the amplifier in an unsafe manner. If feedback resistor 72 were to short, this would short the impedance $1/jWC_f$ of capacitor 60, and the gain of the amplifier would approach zero which is a safe condition. If feedback resistor 72 were to open there would be substantially no effect on the gain of the network since resistor 72 was chosen to originally have an impedance $R_f$ much, much greater than the impedance of capacitor 60. If the input resistor 50 were to open, the input impedance $R_I$ would approach infinity causing the gain of the amplifying circuit to approach zero which again is a safe condition. If capacitor 60 were to short, the impedance $1/WC_f$ would approach zero, and, as a result, the gain of the amplifier circuit would approach zero which is a safe condition of operation. Since, for the failure modes in which $R_f$, $R_I$ or C increase or in which $R_f$ decreases, the amplifier circuit of FIG. 3 limits gain to a predetermined value, and since the failure modes in which $R_I$ or C decrease are excluded by component selection, the circuit can be said to be failsafe.

Figure 4:
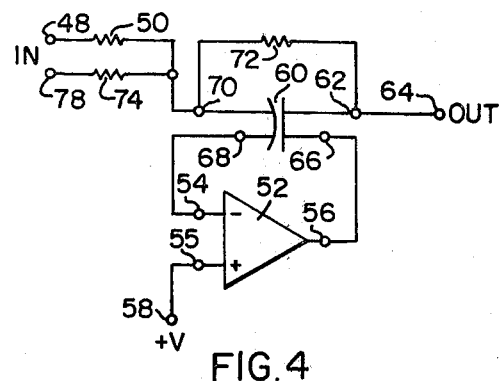
FIG. 4 is a schematic diagram representation of a modification of the inverting amplifier apparatus of FIG. 3, with the four terminal capacitor connected to a second amplifier apparatus input terminal through a second input impedance.

FIG. 4 represents a schematic diagram of the amplifier of FIG. 3 except that the amplifier of FIG. 4 is provided with a second input resistance 74 connected between a second amplifier circuit input terminal 78 and terminal 70 of capacitor 60. It can be seen that the inverting amplifier circuit of FIG. 4 is especially useful in applications that demand a summing operation. The inverting amplifier of FIG. 4 allows such summing operations by virtue of the fact that the amplifier maintains a virtual ground at a capacitor terminal 70 thus allowing the amplifier circuit to provide more than one input. A virtual ground is a point in the circuit at which the voltage does not significantly change with a change in the input voltage while, at the same time, the voltage at the output terminal varies in opposition with the voltage of the input terminal.

Figure 5:
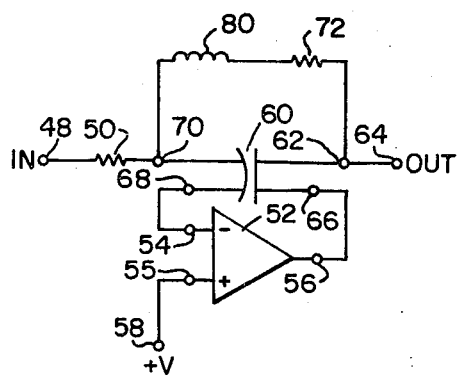
FIG. 5 is a schematic diagram representation of a modification of the inverting amplifier apparatus of FIG. 3, with an inductor in the amplifier feedback impedance.

FIG. 5 shows an operational amplifier similar to the amplifier of FIG. 3 but with the modification of an inductor 80 in series with feedback resistor 72. Inductor 80 provides for the accomplishment of a resonant parallel feedback circuit comprised of two branches. A first branch travels from amplifier output terminal 56 to capacitor terminal 66, through capacitor 60 to capacitor terminal 68, and then to amplifier input terminal 54. The second branch of the resonant circuit travels from amplifier output terminal 56 to capacitor terminal 66, then to capacitor terminal 62, through feedback resistor 72 and feedback inductor 80, to capacitor terminal 70, to capacitor terminal 68, and, finally, to amplifier input terminal 54.

The gain of the circuit of FIG. 5 may be represented by the above equation (1), where:

$Z_f$ is the impedance of the feedback circuit of amplifier 52; and $Z_I$ is the impedance of the input to amplifier 52.

For the circuit of FIG. 5, $Z_f$ may be represented by the following equation:

$$Z_f = \frac{(R_f + jWL)(-j/WC)}{R_f + jWL - j/WC} \quad (6)$$

where:

$R_f$ is the impedance of resistor 72, $-j/WC$ is the impedance of capacitor 60, $jWL$ is the impedance of inductor 80; and, $W$ is the frequency of the input signal.

This equation may be rewritten as follows:

$$Z_f = \frac{\frac{L}{C}(1 + R_f/jWL)}{R_f + j(WL - 1/WC)} \quad (7)$$

In a low-loss circuit (a circuit with high Q), near resonance, $R_f$ is very much smaller than $WL$ and $Z_f$ can be approximated as:

$$Z_f = \frac{L}{C} \cdot \frac{1}{R_f + j(WL - 1/WC)} \quad (8)$$

Since, by definition, at resonant frequency:

$$W_o L = 1/W_o C \quad (9)$$

where:

$W_o$ is the resonant frequency.

The impedance to the circuit at resonance is:

$$Z_f = \frac{L}{R_f C} = \frac{W_o^2 L^2}{R_f} \quad (10)$$

The input impedance $Z_1$ equals $R_I$, the impedance of resistor 50. Therefore, the gain of the circuit of FIG. 5 may be written as:

$$G = \frac{Z_f}{Z_I} = \frac{W^2 L^2}{R_f R_I} = \frac{1}{W^2 C^2 R_f R_I} \quad (11)$$

As with the circuits of FIGS. 3 and 4, it can be seen from equation (11) that for certain values of feedback and input impedance, the gain of the circuit of FIG. 5 will be failsafe for predetermined failure modes. If the input resistor 50 were to short, the impedances $R_f$ or $R_I$ would approach zero and the gain would approach infinity. If the inductance $L$ of inductor 80 were to increase, the value of impedance $WL$ would increase causing the gain to increase. If the capacitance $C$ of capacitor 60 were to decrease, the value of the impedance $1/WC$ would increase and the gain would increase. Therefore, the failure modes in which $R_f$, $R_I$, or $C$ decrease or in which $L$ increases must be excluded from possible failure mode by component selection in order for the amplifying circuit of FIG. 5 to be failsafe.

From equation (11) it can also be seen that, for other possible component failure modes, the gain will be controlled in a failsafe manner. If $R_f$ or $R_I$ increase because the feedback resistor 72 or the input resistor 50 open circuit or increase resistance, the circuit gain will also decrease. If $1/WC$ decreases because the capacitance of capacitor 60 increases, gain will go down. If $WL$ decreases because the inductance of inductor 80 decreases, gain will again go down. Since, for the failure modes in which $R_f$, $R_I$, or $C$ increase or in which $L$ decreases, the amplifier circuit of FIG. 5 limits gain to a predetermined value, and since the failure modes in which $R_f$, $R_I$, or $C$ decrease or in which $L$ increases are excluded by component selection, the amplifier circuit of FIG. 5 can be said to be failsafe.

FIG. 6 is an amplifier circuit similar to the circuit disclosed in FIG. 5 and illustrating the summing modification described in connection with FIG. 4. The amplifier of FIG. 6 is provided with a second input resistance 82 connected between a second amplifier circuit input terminal 84 and terminal 70 of capacitor 60. It can be seen that the inverting amplifier circuit of FIG. 6 is especially useful in applications that demand a summing operation. The inverting amplifier of FIG. 6 provides for summing operations by maintaining a virtual ground at capacitor terminal 70 which allows the amplifier circuit to accommodate more than one input.

In addition to failure of capacitor, resistor, and inductor components in the amplifier circuits of FIGS. 3, 4, 5 and 6, there may be non-component, terminal connection failures in the feedback circuit. More specifically, these non-component failures may occur at capacitor terminals 62, 66, 68 or 70, and may have either a capacitive or resistive effect. If the connection at any of the capacitor terminals 62, 66, 68 or 70 is capacitive, the feedback path would become open and amplifier 52 would lose DC control causing the amplifier circuit gain to decrease to zero. If the connection at any of the capacitor terminals 62, 66, 68 or 70 is resistive, the effect on amplifier circuit gain will depend on which terminal is involved. If the connection at terminal 62 or 70 is resistive, this resistance attenuates with the resistance of feedback resistor 72 to decrease gain in accordance with the gain equations (5) or (11). If the connection at terminal 66 is resistive, the gain will be maintained until the amplifier 52 saturates, after which the gain will decrease. If the connection at terminal 68 is resistive, gain is maintained until the connection impedance and amplifier input impedance form a dividing circuit causing gain to decrease. Therefore, the amplifier circuits of FIGS. 3, 4, 5 and 6 will be failsafe for all non-component failure modes involving capacitor terminals 62, 66, 68 and 70.

As explained above, the disclosed inverting amplifier circuits of FIGS. 3, 4, 5 and 6 offer an improvement over prior art inverting amplifier circuits by providing a failsafe predetermined gain for specified failure modes of the amplifier circuit. At the same time, the disclosed inverting amplifier produces a gain which is characteristic of inverting prior art amplifiers and radically different than non-inverting prior art amplifiers.

Curve 7A of FIG. 7 is a graphic representation of the gain of the inverting prior art amplifier circuit of FIG. 1 with respect to frequency. Curve 7B of FIG. 7 is a graphic representation of the gain of the non-inverting, prior art amplifier of FIG. 2. Curve 7C of FIG. 7 is a graphic representation of the disclosed inverting amplifiers of FIGS. 3 and 4. Curve 7D of FIG. 7 is a graphic representation of the disclosed inverting amplifier of FIGS. 5 and 6.

As shown in Curve 7A, the gain of the inverting prior art amplifiers is at a high value for relatively low frequencies and, at a predetermined frequency $F_1$, decreases in a linear fashion. The gain of the inverting, prior art amplifier of Curve 7A may be contrasted with the gain of the non-inverting, prior art amplifier shown in Curve 7B.

In Curve 7B, the low frequency gain is unity but, as frequency continues to increase the gain begins to increase linearly at some predetermined frequency $F_2$. The gain will then continue to increase linearly with increasing frequency until predetermined frequency $F_3$ is reached after which gain remains constant until reaching predetermined frequency $F_4$. Above frequency $F_4$, the gain decreases in a linear fashion until reaching zero at some frequency $F_5$ where it thereafter remains.

Curve 7C illustrates the gain of the disclosed, inverting amplifier circuits of FIGS. 3 and 4. The gain of the inverting amplifier circuits of FIGS. 3 and 4 is at a high value for relatively low frequencies and, at a predetermined frequency $F_6$, decreases linearly with increasing frequency.

Curve 7D illustrates the effect on gain resulting from the addition of the inductance 80 shown in the amplifying circuits of FIGS. 5 and 6. For low frequencies, the gain is at a moderate value depending on the impedances $R_i$ and $R_f$. However, as the frequency increases, the impedance ($jWL$) of inductor 80 causes the gain to increase providing a higher gain than what is achievable with the single capacitor of FIGS. 5 and 6. As the frequency increases even higher, the effect of the impedance ($1/jWC$) of capacitor 60 begins to offset the effect of the impedance ($jWL$) of inductor 80 providing a substantially flat frequency response over a limited frequency region around some predetermined frequency $F_7$. For frequencies substantially above $F_7$ the gain decreases in a progressively linear fashion with increasing frequency.

I claim:

1. In an inverting amplifier apparatus having an input signal terminal and an output signal terminal and having a failsafe controlled gain in relation to predetermined failure modes, the combination comprising:
    amplifier means having first and second inputs and an output;
    a feedback impedance including a four terminal capacitor, with two terminals of that capacitor being connected between said first amplifier input and said output such that said gain decreases linearly over a known range of frequencies;
    an input impedance connected between said input signal terminal and a third terminal of said four terminal capacitor; and
    with said output signal terminal being connected to the fourth terminal of said capacitor.

2. The amplifier apparatus of claim 1 including at least one additional input impedance connected to said third terminal of said four terminal capacitor by which said apparatus performs summing operations.

3. The amplifier apparatus of claim 1 in which said feedback impedance includes an inductance such that, over a predetermined frequency range, said apparatus provides a substantially flat frequency response and a higher gain than would be provided without said inductance.

4. The amplifier apparatus of claim 3 including at least one additional input impedance connected to said one terminal of said four terminal capacitor by which said apparatus performs summing operations.

5. In inverting amplifier apparatus having a failsafe predetermined gain, the combination comprising:
    input means;
    output means;
    a source of operating potential;
    amplifier means having first and second inputs and an output, with said second input being electrically connected to said source of operating potential; and
    a capacitor having first, second, third and fourth terminals, with said first terminal being connected to said output means, said second terminal being connected to said output of said amplifier, said third terminal being connected to said first input of said amplifier, and said fourth terminal being connected to said input means.

6. The amplifier apparatus of claim 5 including: of first impedance means connected between said fourth terminal of said capacitor and said input means.

7. The amplifier apparatus of claim 6 including second input means and a second resistor connected between said fourth terminal and said second input means.

8. The combination claimed in claim 6 including: a second impedance means connected between said fourth terminal of said capacitor and said output means.

9. The combination claimed in claim 8 wherein said second impedance means includes a third resistor connected in series with an inductor.

10. In an inverting amplifier circuit for which the voltage gain for an input signal does not exceed a predetermined level regardless of particular failure modes, the combination comprising:
    first input means;
    output means;
    a source of operating potential;
    amplifier means having first and second inputs and an output, with said second input being electrically connected to said source of operating potential;
    capacitor means having first, second, third and fourth terminals, with said first terminal being connected to said output means, said second terminal being connected to said output of said amplifier, and said third terminal being connected to said first input of said amplifier; and
    impedance means connected between said fourth terminal of said capacitor and said first input means.

11. The combination claimed in claim 10 including second input means; and second impedance means connected between said fourth terminal and second input means.

12. The combination claimed in claim 10 including:
    a two terminal inductor having one terminal thereof connected to said fourth terminal of said capacitor means; and
    a second impedance means connected between the remaining terminal of said two terminal inductor and said output means.

* * * * *